(12) United States Patent
Ohsawa et al.

(10) Patent No.: US 8,534,348 B2
(45) Date of Patent: Sep. 17, 2013

(54) HEAT PIPE AND METHOD FOR MANUFACTURING SAME

(75) Inventors: Kenji Ohsawa, Kagoshima (JP); Katsuya Tsuruta, Kagoshima (JP)

(73) Assignee: Molex Incorporated, Lisle, IL (US)

( * ) Notice: Subject to any disclaimer, the term of this patent is extended or adjusted under 35 U.S.C. 154(b) by 1331 days.

(21) Appl. No.: 10/583,504

(22) PCT Filed: Jan. 31, 2006

(86) PCT No.: PCT/JP2006/301925
§ 371 (c)(1),
(2), (4) Date: Apr. 27, 2006

(87) PCT Pub. No.: WO2007/029359
PCT Pub. Date: Mar. 15, 2007

(65) Prior Publication Data
US 2007/0056711 A1   Mar. 15, 2007

(51) Int. Cl.
*H05K 7/20* (2006.01)
(52) U.S. Cl.
USPC .................. 165/104.26; 29/890.032; 361/700
(58) Field of Classification Search
USPC .................. 165/104.26, 104.33; 29/890.032; 228/173.1
See application file for complete search history.

(56) References Cited

U.S. PATENT DOCUMENTS

| | | | |
|---|---|---|---|
| 5,329,993 | A | 7/1994 | Ettehadieh |
| 7,051,793 | B1 | 5/2006 | Schulz-Harder |
| 2004/0011512 | A1 | 1/2004 | Noda et al. |
| 2004/0069460 | A1 | 4/2004 | Sasaki et al. |

FOREIGN PATENT DOCUMENTS

| | | |
|---|---|---|
| DE | 20 2004 007 195 U1 | 10/2004 |
| JP | 57-28991 | 2/1982 |
| JP | 59-173690 | 1/1984 |
| JP | 60-133290 | 7/1985 |
| JP | 5-264182 | 10/1993 |
| JP | 09-126670 | 5/1997 |
| JP | 11-031768 | 2/1999 |
| JP | 11-201671 | 7/1999 |
| JP | 11-287578 | 10/1999 |
| JP | 2001-147084 | 5/2001 |
| JP | 2002-039693 | 2/2002 |
| JP | 2003-240459 | 8/2003 |
| JP | 2004-028557 | 1/2004 |
| JP | 2004-077120 | 3/2004 |
| JP | 2004-311519 | 11/2004 |
| JP | 2004-353902 | 12/2004 |
| JP | 2005-106451 | 4/2005 |
| WO | WO 98/22767 | 5/1998 |
| WO | WO 01/63195 A1 | 8/2001 |

*Primary Examiner* — Allen Flanigan
(74) *Attorney, Agent, or Firm* — Timothy M. Morella

(57) ABSTRACT

A thin and flat type heat pipe with enhanced conductivity. Between an upper member 22 having a rectangular area 24*b* on a lower surface and a lower member 20 having a rectangular area 24*a* on an upper area are provided intermediate plate members 32, 30. The members 32, 30 are each formed with slits 8, constructing a vapor path extending a planar direction, communicating with the rectangular areas 24*a*, 24*b* of the members 22, 20, respectively. Thus, a sealed space is defined by the slits 8 and the rectangular areas 24*a*, 24*b* so that a refrigerant is enclosed in the sealed space. Capillary holes 10 are formed through non-slitted portions of the intermediate plate members 32, 30 so that each capillary hole 10 serves as a capillary path of flow extending vertically to communicate with the rectangular areas 24*a*, 24*b* of the members 22, 20.

8 Claims, 12 Drawing Sheets

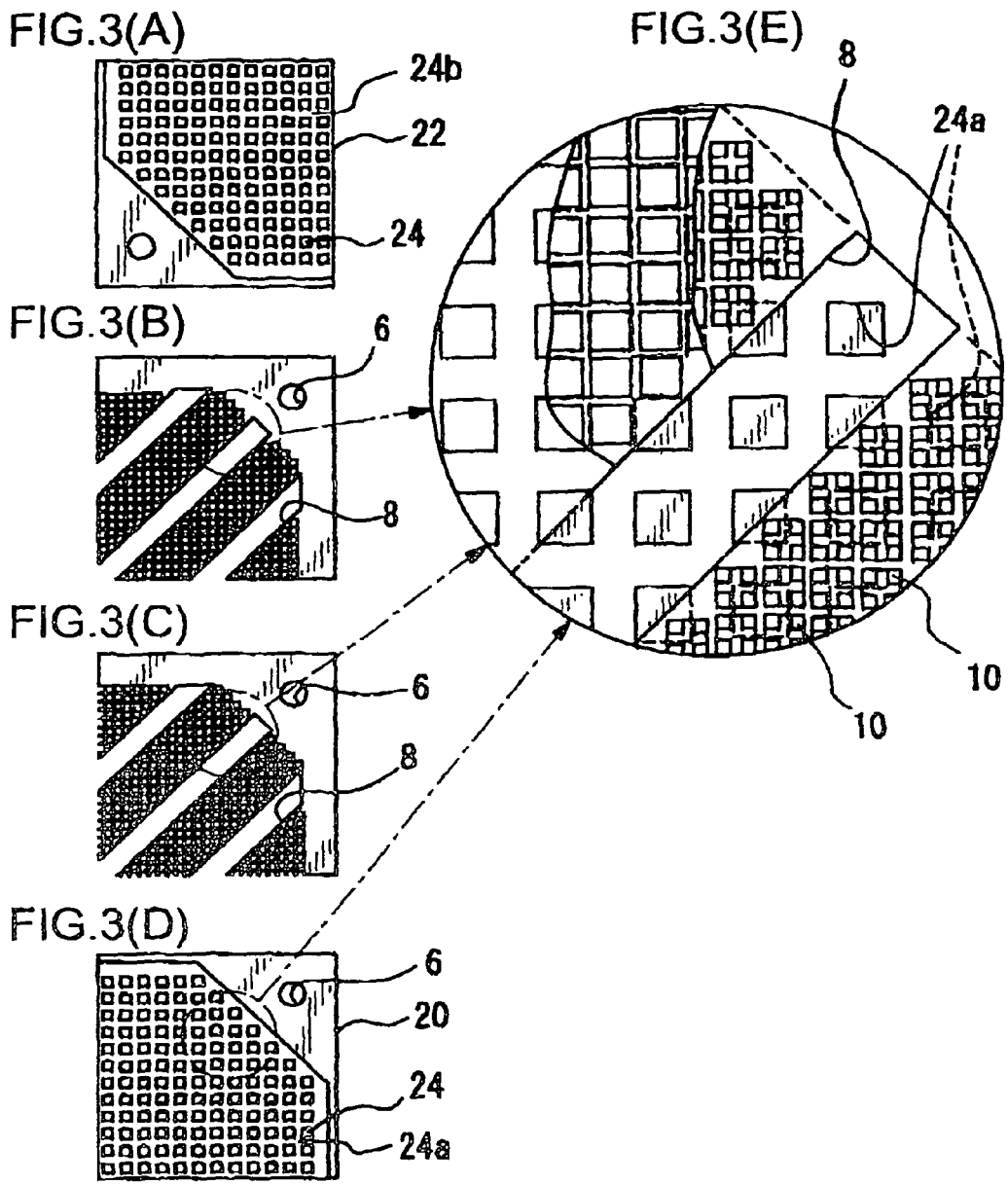

Central Side of the Heat Pipe ←          → Peripheral Side of the Heat Pipe

FIG.8(A) Copper Plate
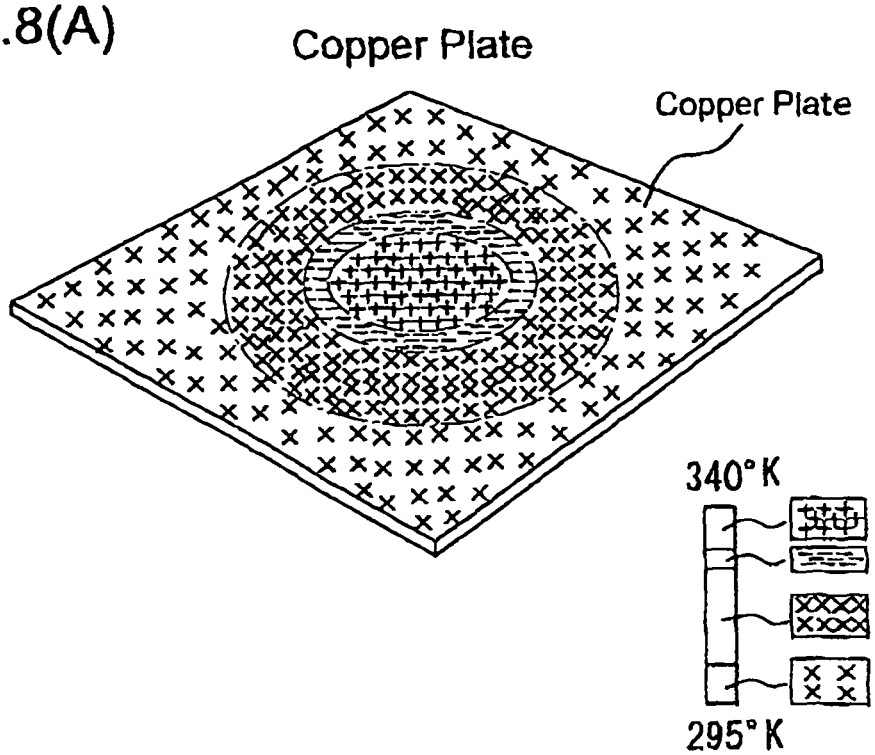
340°K
295°K
FIG.8(B) Heat Pipe of the Present Invention
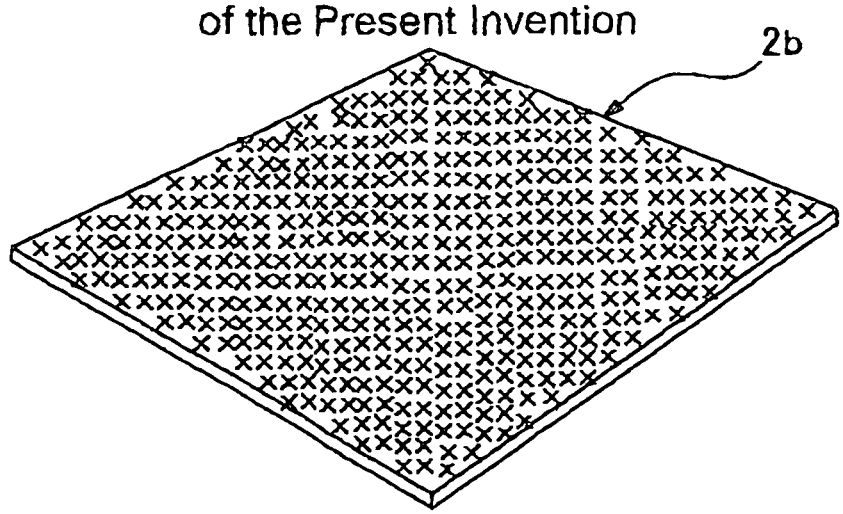

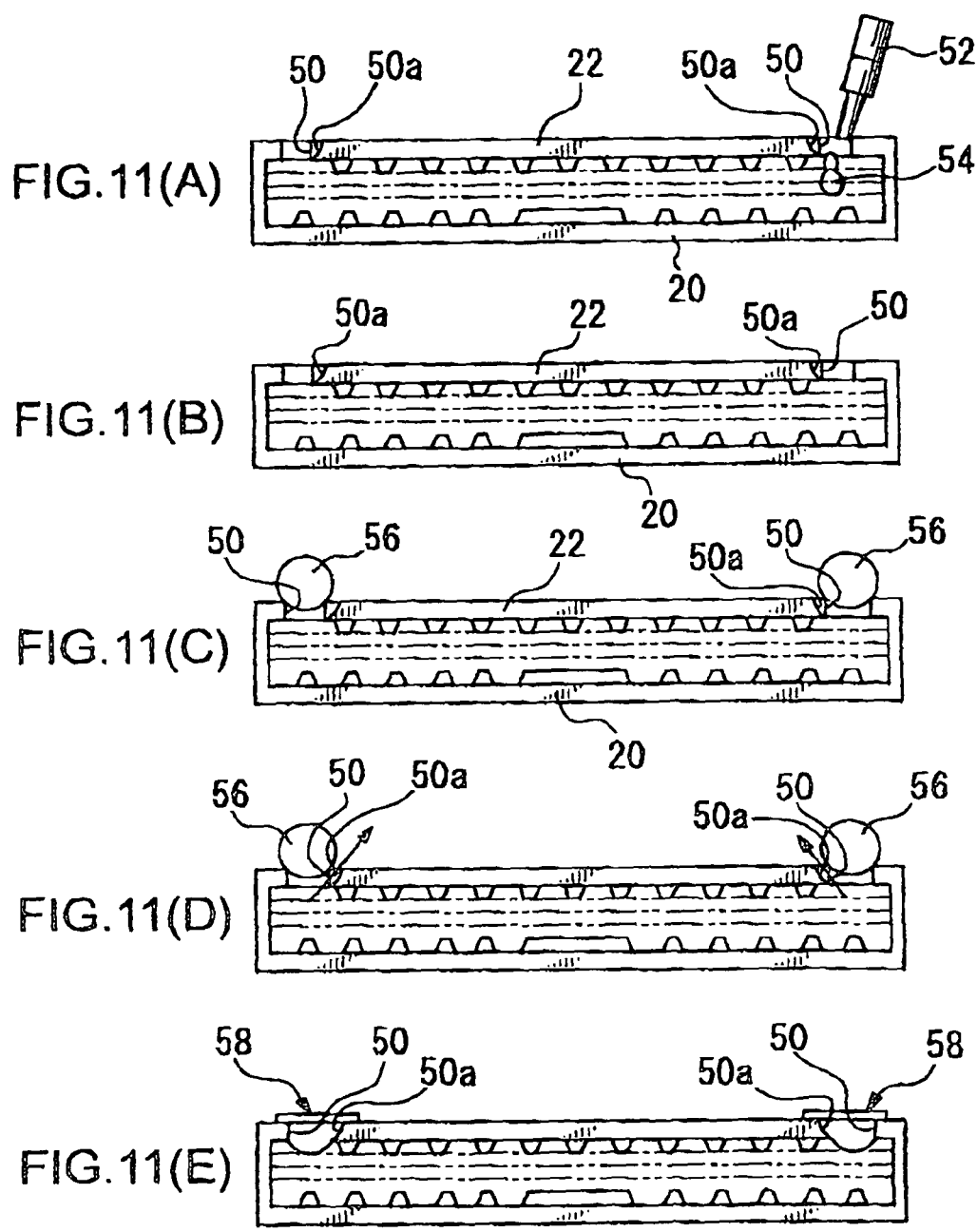

HEAT PIPE AND METHOD FOR MANUFACTURING SAME

TECHNICAL FIELD

The invention relates to a thin heat pipe having good heat conductance and a method for manufacturing the same.

BACKGROUND ART

Conventional heat pipes of this type have been disclosed for example in Japanese Un-examined Patent Publication Nos. 2002-039693 and 2004-077120.

The conventional heat pipes comprise: a container constituted by superimposing wall members on or below stacked partition plates each composed of a thin plate with slits (wig); and a refrigerant enclosed in a container interior space defined by the slits. Particularly, according to the technique described in Japanese Un-examined Patent Publication No. 2002-039693, the partition plates are stacked such that each slit is displaced in its widthwise direction.

Generally, enclosure of a refrigerant into a container interior space is carried out by providing a hole in a side surface, an upper surface or a lower surface of a heat pipe, charging a refrigerant into the container interior through the hole, and then closing the same by caulking or the like.

According to such conventional heat pipes, the heat pipe is constituted from thin and tabular components, and thus there is an advantage that a flat and thin heat pipe of so-called "flat type" can be provided. Furthermore, there are other advantages which no prior heat pipes have, such as extremely excellent heat conductance due to a portion with which the slits are communicated serving as a flow passage for the refrigerant as well as a section where the slits are displaced serving as a movement passage through which the refrigerant is movable with the and of a capillary phenomenon.

DISCLOSURE OF THE INVENTION

Problems to be Solved by the Invention

Although the above-mentioned heat pipes have an advantage that heat conductance can be enhanced despite their thin and tabular shapes, there has been a persistent demand for further enhancement of heat conductance, and thus the demand for improvement in heat conductance is going on increasing.

Moreover, the conventional heat pipes have been inefficient in enclosing a refrigerant such as water into a container interior space. This is because after charging a refrigerant into a container interior space through refrigerant charging holes, caulking for fixing a sealing member was necessary for each refrigerant charging hole. This has been a hindrance to enhancement of productivity to be attained through the manufacture of a large number of heat pipes simultaneously to achieve price reduction.

Furthermore, there has also been a problem that the sealing member fixed to the container by caulking often protrudes from an outer surface of the container and is likely to obstruct the attachment of heat pipes.

Moreover, in the conventional art, when the temperature of the heat pipe rises due to heat generated by the use thereof, there has been a problem that a thermal expansion occurs to the heat pipe due to being subjected to a load to expand in the vicinity of a center thereof, due to thermal expansion of the refrigerant. This is called "popcorn phenomenon".

It has been found out by the inventors of the present invention that such phenomenon can sometimes destroy the joint between the constituting plates of the heat pipe, even resulting in system failure, and thus there is the necessity of compensating strength shortage.

The present invention has been made to meet the above needs, and to solve the various problems associated with the conventional art.

It is, therefore, an object of the present invention to provide a thin and tabular heat pipe with enhanced heat conductance.

It is another object of the present invention to provide a method for manufacturing a heat pipe, which enables easier manufacture of such heat pipes, eventually enabling such thin, tabular heat pipes having good heat conductance to be supplied at low price.

It is a further object of the invention to provide a method for manufacturing a heat pipe, which enables further reduction of manufacturing costs through the simultaneous enclosure of refrigerants into a large number of heat pipes.

Still further, it is a object of the invention to prevent the flatness of the outer surface of the heat pipe from being impaired by a sealing member, which enables further reduction of manufacturing costs through the simultaneous enclosure of refrigerants into a large number of heat pipes.

In addition to the foregoing, it is a further object of the invention to prevent thermal expansion from being caused by heat from a device to be cooled during use of the heat pipe and to prevent failure or short-lived tendency of the product by the expansion, to thereby enhance the reliability of a heat pipe.

Means for Solving the Problems

A heat pipe of a first aspect of the invention comprises:
an upper member having a concave portion on a lower surface;
a lower member having a concave portion on an upper surface;
one or more intermediate plate members provided between said upper member and said lower member, said intermediate plate member including a plurality of slits, constructing a vapor path extending in a planar direction, communicating with the concave portions of said upper and lower members to form a sealed space defined by said slits and concave portions,
a refrigerant enclosed in said sealed space, and
capillary holes formed through a non-slitted portion of said intermediate plate member, said capillary hole serving as a capillary path of flow extending vertically or both vertically and horizontally, communicating with the concave portions of said upper and lower members.

According to a first aspect of the present invention, paths of vapor for use with a refrigerant that extends in a planer direction can be defined by the slits formed through the intermediate plate members, while the capillary holes vertically formed through the one or more intermediate plate members define capillary paths of flow, whereby it is possible to add heat conduction effect by the capillary path of flow to the conventional heat conductance effect by the tabular heat pipe, this strengthening the heat conduction effect of the heat pipe.

Specifically, more capillary holes are provided in non-slitted portions of the intermediate plate members, proportion of an area that contributes to the heat conduction relative to an area occupied by the heat pipe can be made greater, thus enabling the noticeable enhancement of the heat conduction effect.

A second aspect of the invention is a heat pipe set forth in the first aspect, wherein said intermediate plate members are more than one, each intermediate plate member having the capillary hole defined as a though-hole having a certain planar area, such that the though-holes of said intermediate plate members are overlapped only partially to define said capillary path of flow having a planar area narrower than that of each through-hole.

According to the second aspect of the invention, there is provided the heat pipe of the first aspect, in which the though-holes of said intermediate plate members are overlapped only partially to define said capillary path of flow having a planar area narrower than that of each through-hole. Thus, it is possible to make the substantial area of each capillary hole smaller than the through-hole formed in each intermediate plate member, thus facilitating the capillary phenomenon, enhancing the heat conduction effect. This, in other words, means that the present invention enables the formation of such a narrow (or minute) capillary hole that goes beyond the limit of miniaturization techniques for miniaturizing the through-hole of the intermediate plate member.

A third aspect of the invention is a heat pipe of one of the forgoing aspects, wherein the heat pipe further comprises an device mounting section provided on an outer surface of at least one of said upper and lower members, said device being to be cooled by heat pipe, wherein said device mounting section is formed integrally with a plurality of projections.

Thus, a plurality of the projections are integrally formed on the outer surface of at least one of said upper and lower members, and such projection forming section is allocated to the said device mounting section, and thus the cooling effect to the device can be further improved.

This is due to the fact that generally when a bottom surface of a device to be cooled is attached to a certain flat surface such as that of a heat pipe, a thin layer of air having an extremely large heat transfer resistance is often present therebetween, which makes it difficult to enhance the heat conductance. This is because when certain surfaces having substantial areas are brought into close contact with each other, a phenomenon that air is confined within an interior between the closely contacted surfaces is likely to occur, even though the interior is minute one.

Therefore, it is not rare that full heat dissipation ability required for an electronic device to be cooled such as CPU is unable to be obtained when CPU has such a large heat release value that it requires stronger heat dissipation effect.

According to the heat pipe of the third aspect of the invention, minute projections are provided on the device mounting section, and thus the projections and am attachment surface of the device to be cooled can be closely contacted by each other, without a layer of air present therebetween.

Further, there may be provided a silicone resin between a projection-free portion and a bottom surface of the device to be cooled to thereby reduce heat resistance therebetween.

Accordingly, the heat pipe of the third aspect of the invention enables the strengthening of the cooling effect to the device to be cooled, and thus there can be provided an optimal heat pipe for heat dissipation of CPU or the like.

A heat pipe of a fourth aspect of the invention is the one set forth in one of the foregoing aspects, wherein said heat pipe has a rectangular planar shape, wherein said device mounting section is arranged in the center of said heat pipe, while each of said slits extends in an oblique direction relative to sides of said heat pipe or in a radial direction from said device mounting section.

Accordingly, effective heat dissipation from the center of the heat pipe toward the corners thereof is realized, and thus it is possible to make substantially the whole area of the heat pipe including its corners contribute to the heat dissipation, thereby enhancing heat conduction effect further.

A heat pipe of a fifth aspect of the invention is the one set forth in one of the third and fourth aspects, wherein said upper member, intermediate plate members and lower member are joined to each other by hot pressure-welding of projections partially formed in a peripheral portion of said heat pipe and from a peripheral portion of said device mounting section to a neighborhood thereof.

Accordingly, thermal expansion due to heat from a device to be cooled, and destruction of the heat pipe itself caused by the expansion can be prevented, to thereby enhance the reliability and durability of the heat pipe.

A sixth aspect of the invention is a method for manufacturing a heat pipe, at least comprising the steps of:

preparing a lower member having a concave portion on an upper surface, an upper member having a concave portion on a lower surface, and one or more intermediate plate members including a plurality of slits, constructing a vapor path extending in a planar direction, communicating with the concave portions of said upper and lower members when said members are joined together.

forming projections on at least one of opposite surfaces of said members to be joined so that said projections are formed in a peripheral portion of said heat pipe and from a peripheral portion of said device mounting section to a neighborhood thereof; and joining said upper member, one or more intermediate plate members and lower member together by hot pressure-welding of said members in positions where said projections are formed.

Accordingly, heat and pressure are allowed to be concentrated on portions to be joined in the respective members so that they are joined together simultaneously where the projections for joint purpose are formed. As a result, the joining process essential for integration of the members into a heat pipe can be performed without a separate welding or bonding process.

A seventh aspect of the invention is a heat pipe, comprising:

an upper member having a concave portion on a lower surface;

a lower member having a concave portion on an upper surface;

one or more intermediate plate members provided between said upper member and said lower member, said intermediate plate member including a plurality of slits, constructing a vapor path ending in a planar direction, communicating with the concave portions of said upper and lower members, said members being stacked to form a sealed space defined by said slits and concave portions;

one or more refrigerant charging holes formed through one of said upper and lower members, said charging holes communicating with said sealed space;

a refrigerant enclosed in said sealed space, and a sealing plug for sealing each of said refrigerant charging holes, said sealing plug being made from ductile metal.

Accordingly, refrigerant is chargeable though the refrigerant charging hole into the sealed space, which is sealed by the sealing plug made from ductile metal such as solder, thus enabling the preventing of the leakage of the refrigerant from the sealed space to the outside.

In sealing by the sealing plug made from ductile metal, the ductile metal is placed on the refrigerant charging hole after charging the refrigerant, and then pressure is applied thereto, thus enabling the ductile metal to be brought gradually into plastic flow. As a result, the refrigerant charging hole can be sealed by the ductile metal that is in a state of plastic flow. After being sealed, heating is stopped so that the ductile metal that seals the refrigerant charging hole serves as the sealing plug.

Accordingly, simultaneous enclosure of the refrigerant can be carried out all at once for a large number of heat pipes. As a result, mass-productivity can be enhanced, resulting in making great contribution to price reduction.

A heat pipe of an eighth aspect of the invention is the one set forth in the seventh aspect, further comprising one or more degassing grooves formed on a peripheral inner surface of each of said refrigerant charging holes, wherein said degassing groove keeps an interior space being communicated with an exterior space until each refrigerant charging hole is sealed fully by said sealing plug, while said degassing groove allows the refrigerant charging hole to be sealed when each refrigerant charging hole is sealed fully by said sealing plug.

Accordingly, with the ductile metal being placed on each refrigerant charging hole, degassing is performed through the degassing groove under reduced pressure (vacuum), and then the refrigerant charging hole is sealed by the ductile metal to thereby provide the fully sealed space within the heat pipe.

Under that condition, the degassing groove also is sealed, and thus the sealed space of the heat pipe is completely shut off from the exterior thereof, so that no leakage of the refrigerant is likely to occur.

A heat pipe of a ninth aspect of the invention is the one set forth in the seventh or eighth aspect, wherein each refrigerant charging hole has a larger diameter in a top portion thereof than in a bottom portion thereof, while a surface of said sealing plug for sealing each refrigerant charging hole is not protruded from an outer surface of the member formed with said refrigerant charging hole.

Accordingly, the remainder of the ductile metal that has fully filled the smaller bottom portion is allowed to be appropriately accommodated into the larger top portion, thereby enabling the same to be prevented from protruding from the outside surface of the heat pipe. As a result, it is possible to prevent any projection that may impair the flatness of the heat pipe from being produced by the sealing process.

A tenth aspect of the invention is a method for manufacturing a heat pipe, said method at least comprises the steps of:

preparing a lower member having a concave portion on an upper surface, an upper member having a concave portion on a lower surface, and one or more intermediate plate members including a plurality of slits, constructing a vapor path extending in a planar direction, communicating with the concave portions of said upper and lower members when said members are joined together;

forming projections on at least one of opposite surfaces of said members to be joined; and joining said upper member, one or more intermediate plate members and lower member together by hot pressure-welding of said members in positions where said projections are formed;

supplying a refrigerant into said sealed space through said refrigerant charging hole under reduced pressure; and placing a ductile metallic body serving as said sealing plug in each refrigerant charging hole, and then pressure-welding said ductile metallic body to thereby provide said sealing plug for sealing each refrigerant charging hole.

According to the method, simultaneous sealing can be carried out through a single sealing process for a large number of heat pipes.

BRIEF DESCRIPTION OF THE DRAWINGS

FIGS. 1(A) to 1(D) show one embodiment of a heat pipe of the present invention, in which FIG. 1(A) is a bottom view thereof, FIGS. 1(B) and 1(C) plan views thereof where an upper member is removed and a principal part is enlarged in the latter, FIG. 1(D) a section thereof, respectively.

FIGS. 2(A) and 2(B) also show the foregoing embodiment, in which FIG. 2(A) is an exploded perspective view thereof, while FIG. 2(B) a perspective view of a lower member thereof which is turned upside down.

FIGS. 3(A) to 3(E) show plan views of respective members of the heat pipe of the foregoing embodiment, in which only the upper member is turned upside down, while FIG. 3(E) is a partially cutaway enlarged view thereof.

FIGS. 4(A) to 4(D) show an explanatory diagram illustrating a method for manufacturing the heat pipe of the foregoing embodiment of the present invention, in which FIG. 4(A) to 4(C) are sections thereof showing manufacturing steps thereof in chronological order, while FIG. 4(D) a plan section thereof in which a refrigerant is enclosed therein.

FIGS. 8(A) and 8(B) are perspective views of a copper plate and the heat pipe of the present invention, showing the result of heat dissipation simulation where temperature distribution in the case that a central region of the lower portion thereof is heated is schematically shown.

FIGS. 9(A) to 9(C) show an intermediate plate member for use with another embodiment of the invention in which FIG. 9(A) is a perspective view thereof, FIG. 9(B) is a section thereof taken along B-B line of FIG. 9(A), and FIG. 9(C) is a plan view of an device mounting section, said device mounting section being formed with a projection for hot pressure welding.

FIGS. 11(A) to 11(E) are sections of a heat pipe manufactured by a method according to another embodiment of the invention, illustrating manufacturing steps thereof in chronological order.

FIGS. 12(A) and 12(B) show one example of a refrigerant charging hole formed on the upper member of the heat pipe of the invention, in which FIG. 12(A) is a plan view thereof, while FIG. 12(B) is a section thereof.

FIGS. 13(A) and 13(B) show another example of a refrigerant charging hole formed on the upper member of the heat pipe of the invention, in which FIG. 13(A) is a plan view thereof, while FIG. 13(B) is a section thereof.

FIGS. 14(A) and 14(B) show a further example of a refrigerant charging hole formed on the upper member of the heat pipe of the invention, in which FIG. 14(A) is a section prior to sealing, while FIG. 14(B) is a section after sealing.

BEST MODE FOR CARRYING OUT THE INVENTION

Figure 1A:
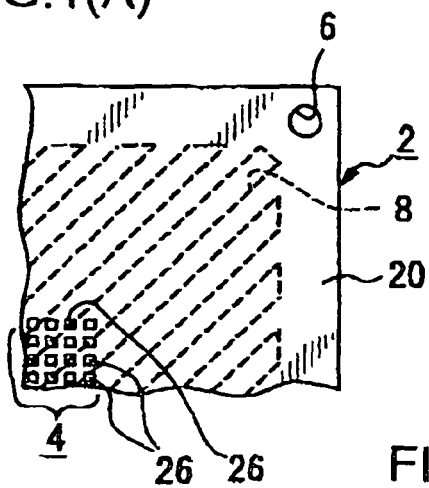

The heat pipe of the present invention basically comprises an upper member, a lower member, and one or more intermediate plate members formed with slits and vertical (or oblique) through-holes serving as capillary holes. For the material of those upper and lower members and intermediate plate members, copper is optimal since it has high heat conductance.

An electronic device to be cooled by the heat pipe, such as IC (semiconductor integrated circuit), LSI (large-scale integrated circuit) or the like is set in an device mounting section provided on a certain part of either one of the upper and lower members, e.g., in the center of the outer (i.e., lower) surface of the lower member. In the case of the device whose heat discharge is large, such as CPU, the device mounting section may be provided with a projection formed integrally therewith.

Whilst the slit may be parallel to either long or short side of the heat pipe, it may be more preferably extended obliquely. That is because the one extended obliquely enables effective heat dissipation toward corners of the heat pipe, as contrasted to the fact that the slit parallel to the long or short side of the heat pipe does not enable effective heat dissipation from the center of the heat pipe toward the outside thereof.

Specifically in the case that a slit is formed radially from the device to be cooled, heat can be efficiently dissipated entirely and uniformly from the center of the heat pipe where the electronic device to be cooled is placed to the perimetric portion thereof including all of four corners thereof. Accordingly, the heat-conduction effect can be enhanced, this providing an optimal heat pipe.

In the case where the two or more intermediate plate members are provided, the corresponding slits may be superimposed completely, or otherwise, they may be displaced in the width direction, as disclosed by Japanese Un-examined Patent Publication No. 2002-039693. In the herein below described embodiments, the intermediate plate members are laid on top of another so that the slits are not displaced in the width direction.

Alternatively, in the case where the two or more intermediate plate members are provided, those intermediate plate members may be provided between the upper and lower members so that the position, shape and size of the through-hole of each intermediate plate member may coincide to thereby construct a capillary hole having the same position, shape and size as the through-hole of each intermediate plate member.

The capillary hole may have a rectangular shape (for example, square or oblong shape), of which the corners may or may not be rounded. Although it is to be of a rectangular fundamentally, a part or whole side thereof (i.e., peripheral inner surface of the capillary hole) may be corrugated or wrinkled so as to enlarge a surface area thereof, because a cooling effect is enhanced if the peripheral inner surface area of the capillary hole is large.

Alternatively, the capillary hole may take a hexagonal, circular or elliptical shape. It should be noted that the shape of the capillary hole should not be necessary limited to any specific shape.

On the other hand, in order to form the capillary hole with a smaller cross-sectional area, the two or more intermediate plate members may be suitably displaced from the positions where the respective through-holes are precisely aligned with one another so as to be only partially overlapped, thereby enabling the substantive cross-sectional area of the capillary hole to be made small as compared with the cross-sectional area of the through-hole of each intermediate plate member.

More specifically, by displacing the respective intermediate plate members by a half pitch in a predetermined direction (e.g., lateral or radial direction), with the size, shape and arrangement pitch of each through-hole being kept the same, it is possible to reduce the substantive cross-sectional area of the capillary hole to about ½ of that of the through-hole of each intermediate plate member.

Furthermore, if the position of the through-hole of each intermediate plate member is also displaced in a direction orthogonal to the foregoing direction (for example, longitudinal direction). The substantial cross-sectional area of the capillary hole can be reduced to about ¼ of that of the through-hole of each intermediate plate member.

In other words, the size of the capillary hole can be notably reduced to ¼ for example, exceeding the limit of the machining accuracy of the through-hole of each intermediate plate member, thus eventually enabling the enhancing of the capillary effect.

In that case, the through-hole of the intermediate plate member adjacent to the undersurface of the upper member needs to communicate with a concave portion on the undersurface of the upper member, while the through-hole of the intermediate plate member adjacent to the upper surface of the lower member needs to communicate with a concave portion on the upper surface of the lower member, respectively.

Alternatively, more effective heat dissipation may be carried out by allowing the displacing (or overlapping) direction to coincide with a certain specific direction effective for heat dissipation.

For example, when a device to be cooled, such as CPU, is aced to the outside surface of the lower member, the intermediate plate members may be displaced such that the upper the intermediate plate is, the more the through-hole is displaced outwards to thereby form the capillary hole, whereby the through-hole is formed so as to extend substantially obliquely outwards rather than vertically, so that the refrigerant which absorbed the heat from the device to be cooled is allowed to spread peripherally while going up through the capillary hole, thus facilitating the heat dissipation toward the outside. Accordingly, more effective cooling is achieved.

In the manufacture of the heat pipe of the invention, the upper member, the intermediate plate members and the lower member may be produced separately such that they are formed with projections on at least one of the adjacent members to be joined, which may be formed into a single piece by heat press after suitable position adjustment, thereby completing all manufacturing steps except the step for the filling of refrigerant. Then, a predetermined amount of refrigerant is charged through two charging openings (one for supplying refrigerant, the other for air outlet) formed on a part of the heat pipe (e.g., on the upper or lower member) under reduced pressure (e.g., under vacuum). Then, the refrigerant charging openings are closed by caulking or the like, thus completing the heat pipe of the present invention.

Although it is imperative that the integration of the lower member, the intermediate plates and the upper member by means of heat press, utilizing the aforesaid projections be carried out in the peripheral portions of these members, such integration may be also carried out from the peripheral portions to the neighborhoods of the device mounting section for placing IC or LSI, so that the expansion or swelling due to the above-mentioned popcorn phenomenon can be prevented, thus attaining improved reliability and longer operating life of the heat pipe.

In the meantime, sealing can be performed by for example, the following highly mass-productive method: Namely, either one of the upper and the lower members may be provided with for example a pair of the refrigerant charging openings (one for supplying refrigerant, the other for air outlet, but only one refrigerant charging hole may be provided), and then the lower member, upper member and intermediate plate members are integrated with one another by heat press or the like. Thereafter, by placing the integrated one under the reduced pressure where the refrigerant is changeable into a vapor at ordinary temperature (about 0.5 Pa when the refrigerant is water), a predetermined amount of the refrigerant is filled in the internal sealed space (which is not sealed yet at this stage). Subsequently, ductile metal, such as a solder, is placed on each refrigerant charging hole, and then pressure is applied thereto.

Then, plastic flow takes place in the ductile metallic body due to the heat and pressure, thus gradually plugging the refrigerant charging hole until it is completely plugged. When heating is stopped with the hole being completely plugged, the internal sealed space is brought into a fully sealed state owing to the ductile metallic body. As a result, the metallic body substantially serves as a sealing plug.

Moreover, as for the configuration of a pair of the refrigerant charging holes, one of them (for example, the refrigerant supplying hole) may be positioned at one corner of the rectangular heat pipe, while the other (for example, air outlet) may be positioned at the opposing corner, thus making it easy to supply the refrigerant into the whole interior of the heat pipe.

The above-mentioned sealing method using the sealing plug composed of the ductile metal is highly mass-productive as compared with conventional sealing methods such as caulking.

In that case, the inner surface of the refrigerant charging hole may be formed with one more degassing grooves, thus enabling the sealing by the ductile metallic body to be performed after degassing or while degassing the interior, so that pressure increase in the sealed space due to the sealing by the sealing plug can be prevented.

Moreover, the refrigerant charging hole may be shaped such that a top portion thereof has a larger diameter than a bottom portion thereof, and thus a remainder of the ductile metallic body that has fully filled the smaller bottom portion is allowed to be appropriately accommodated into the larger top portion, thereby enabling the same to be prevented from protruding from the outside surface of the heat pipe. As a result, it is possible to prevent any projection that may impair the flatness of the heat pipe from being produced by the sealing process.

In the meantime, materials having good heat conductance, such as copper, copper alloy, aluminum, aluminum alloy, iron, iron alloy, stainless steel, etc. are suitable for the upper member, intermediate plate member(s), and lower member that make up of the body of the heat pipe, while water (pure water, distilled water, etc.), ethanol, methanol, acetone, etc. is suitable for the refrigerant.

EMBODIMENT 1

Next is a detailed description of embodiments of the present invention with reference to the attached drawings.

Figure 1C:
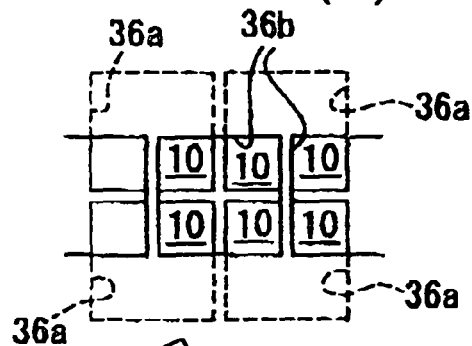
Figure 1B:
Figure 1D:
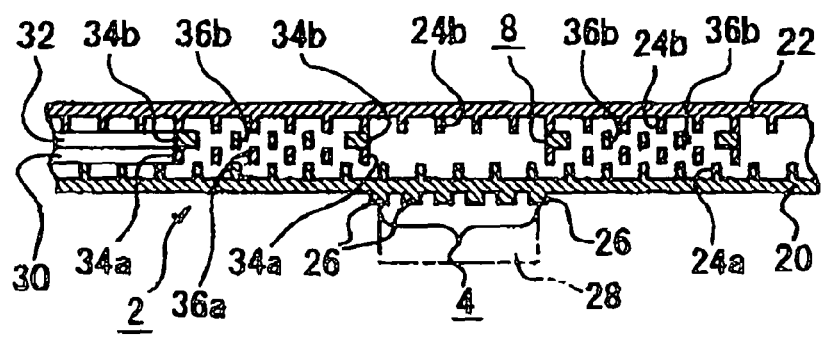
Figure 2A:
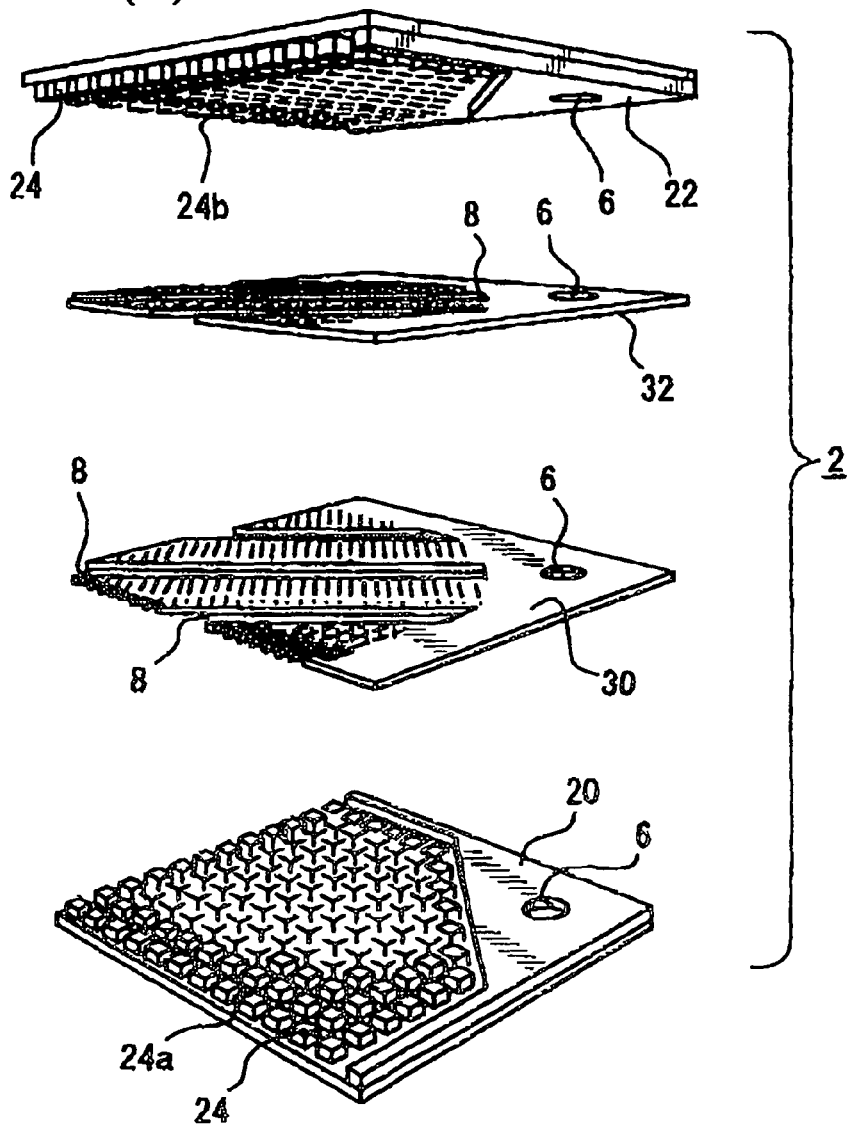
Figure 2B:
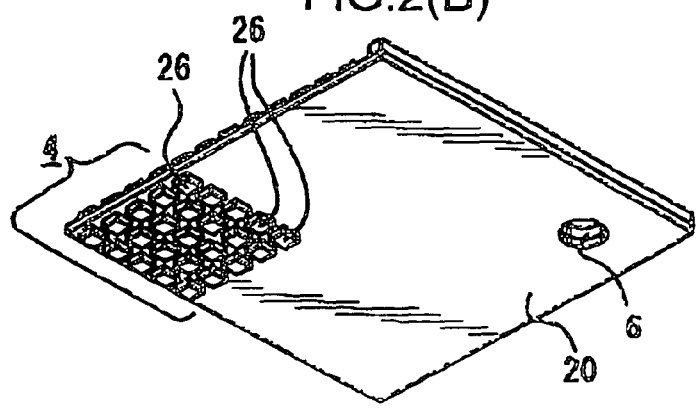

FIGS. 1(A) to 1(D) show a first embodiment of the heat pipe of the present invention, in which FIG. 1(A) is a schematic bottom view thereof, FIGS. 1(B) and 1(C) plan views thereof where the upper member is removed and a principal pant thereof is enlarged in the latter. FIG. 1(D) is a section thereof, respectively. FIGS. 2(A) and 2(B) also show the present embodiment, in which FIG. 2(A) is an exploded perspective view thereof while FIG. 2(B) a perspective view of the lower member thereof which is turned upside down. FIGS. 3(A) to 3(D) show plan views of the respective members of the heat pipe of the embodiment, in which only the upper member is turned upside down, while FIG. 3(E) is a partially cutaway enlarged plan view of these members being stacked, in which the upper member is eliminated for explanation, showing respective encircled parts of the lower member and the upper and lower intermediate plate members.

As shown in FIG. 1(A), a heat pipe 2 of the present embodiment has a rectangular shape, such as a square shape in plan view, having a rectangular region (e.g., a square region) in the center thereof, which serves as a CPU mounting section 4 that comprises hereinafter described projections 26. The heat pipe 2 includes a positioning hole 6 at its four corners, and slits 8 thereinside.

The heat pipe 2 further includes numerous and minute capillary holes 10 in a non-slitted inside portion thereof where the said slits 8 are not formed. These capillary holes 10 are so minute that they are not shown in FIG. 1(A), but they are clearly shown in FIG. 1(B). It should be noted that the provision of the minute capillary holes 10 features the present invention.

Next, the cross-sectional construction of the heat pipe 2 of the embodiment is explained with reference to FIG. 1(D).

Numeral 20 denotes the tabular lower member, while numeral 22 denotes the tabular upper member, each of which is formed from metal such as copper or copper alloy of about 0.8 mm thickness, including a concave portion 24 having a certain thickness (about 0.2 mm, for example) on an inside surface, i.e., the upper surface of the lower member 20 or the undersurface of the upper member 22.

Although these concave portions 24 are communicated with one another, a specific rectangular region among these concave portions 24 that communicates with a hereinafter-described second through-opening 36a for constructing the capillary hole and a first through-hole 34a for constructing the slit of a lower intermediate plate member 30 is designated by numeral 24a, (corresponding to the concave portion 24 of the lower member 20), while another specific rectangular region that communicates with a second through-opening 36b for constructing the capillary hole and a first through-hole 34b for constructing the slit of an upper intermediate plate member 32 is designated by numeral 24b (corresponding to the concave portion 24 of the upper member 22). It should be noted that the term "communicate" used herein shall not be construed as strict alignment of the portions, but it may include a case where there is only a partial alignment between them.

Numeral 26 denotes the projections disposed on the aforesaid CPU mounting section 4 provided in the center of the lower member 20. A device to be cooled, such as CPU 28, is mounted on the CPU mounting section 4.

Numeral 30 designates the lower intermediate plate member, while 32 the upper intermediate plate member, each being formed from a copper member having about 0.1 mm thickness. These lower and upper members 30, 32 are each formed with the first through-holes 34a and 34b for constructing the slit, respectively, which are arranged so as to be strictly aligned with the opposite ones, thus constructing the respective slits 8.

Alternatively, as is proposed in Japanese Un-examined Patent Publication No. 2002-039693, the respective first through-holes 34a, 34b may be displaced appropriately instead of being strictly aligned. In the meantime, each through-hole 34a of the lower intermediate plate member 30 is allowed to communicate with a plurality of rectangular concave portions 24a of the lower member 20, while each through-hole 34b of the upper intermediate plate member 32 is allowed to communicate with a plurality of rectangular concave portions 24b of the upper member 22.

In portions other than the portions where the first through-holes 34a and 34b for constructing the slit are formed, the lower and upper intermediate plate members 30, 32 are formed with the second through-holes 36a, 36b for constructing the capillary hole, at constant pitch, respectively. The second through-holes 36a, 36b have a rectangular shape such as a square shape, having the same side.

Although the size, shape and mutual positional relationship of the through-holes 36a of the lower intermediate plate member 30 are the same as those of the upper intermediate plate member 32, the positional relationship between the opposite through-holes 36a and 36b is displaced such that the former is displaced from the latter by a half pitch both in a direction X and in a direction Y, said directions X and Y being mutually-perpendicular arbitrary directions in a plane.

Through the above relative displacement, overlapping portions between the respective through-holes 36a and 36b can define the substantial capillary holes 10 so that each capillary hole 10 may be formed to have an area about ¼ of that of each through-hole 34a or 34b.

Here, each through-hole 36a of the lower intermediate plate member 30 is always allowed to communicate with the rectangular concave portions 24a of the lower member 20, while each through-hole 36b of the upper intermediate plate member 32 is always allowed to communicate with the rectangular concave portions 24b of the upper member 22.

As described above, each through-hole 34a of the lower intermediate plate member 30 is allowed to communicate with a plurality of rectangular concave portions 24a of the lower member 20, while each through-hole 34b of the upper intermediate plate member 32 is allowed to communicate with a plurality of rectangular concave portions 24b of the upper member 22.

Accordingly, an interior space is constructed by these rectangular concave portions 24a of the lower member 20, the first through-holes 34a and second through-holes 36a of the lower intermediate plate member 30, the first through-holes 34b and second through-holes 36b of the upper intermediate plate member 32, and the rectangular concave portions 24b of the upper member 22, so that a refrigerant is enclosed in the interior space.

According to the heat pipe 2 thus structured, not only a heat conduction cooling effect owing to the vapor path formed by the slits 8 is obtained, but also an additional cooling effect owing to the capillary phenomenon by the capillary holes 10 is obtained, and thus heat conduction effect can be enhanced.

Figure 4A:
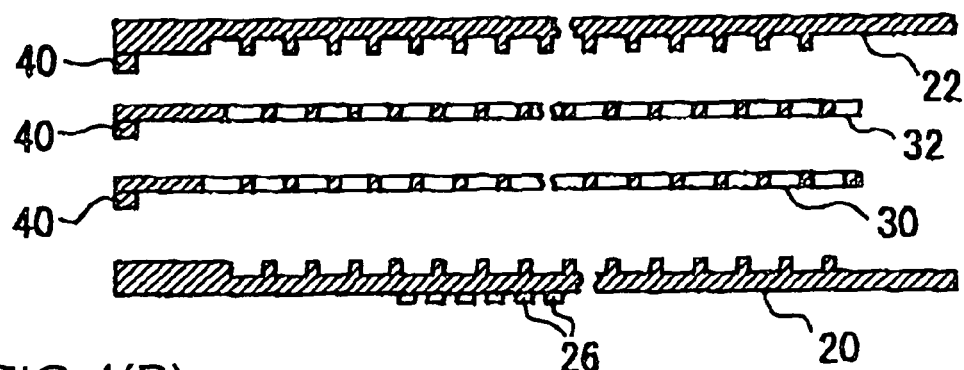
Figure 4B:
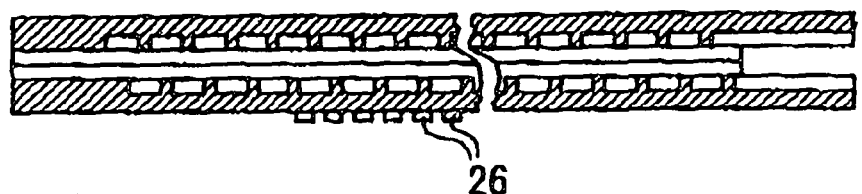
Figure 4C:
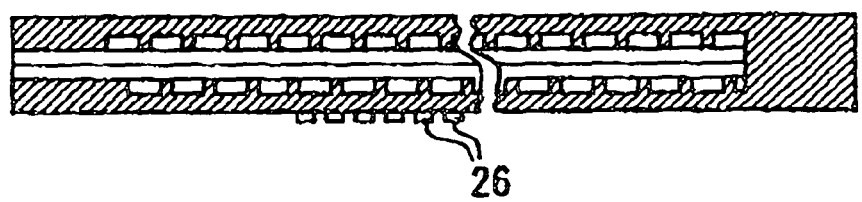
Figure 4D:
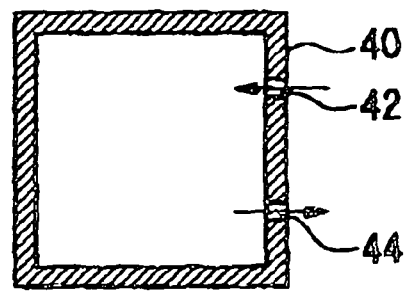

FIGS. 4(A) to 4(D) show an explanatory diagram illustrating a method for manufacturing the heat pipe 2 of the foregoing embodiment of the present invention, in which FIG. 4(A) to 4(C) are sections thereof showing manufacturing steps thereof in chronological order, while FIG. 4(D) a plan section thereof in which a refrigerant is enclosed therein.

(A) First, as shown in FIG. 4(A), the respective members, i.e., the lower member 20, the lower intermediate plate member 30, the upper intermediate plate member 32 and the upper member 22 are prepared. Moreover, peripheral edges of the undersurfaces of the lower and upper intermediate plate members 30, 32 and the upper member 22 are each formed with a projection 40 for pressure welding, except portions used as a pair of the refrigerant charging holes 42, 44 (42 is a refrigerant supplying opening and 44 is an air outlet) as shown in FIG. 4(D). Each projection 40 has a height of about 35 μm and a width of about 50 μm (which is a width at a proximal side, as its width becomes greater at a proximal side that at a distal side due to side etching taking place at the time of formation by the selective etching).

(B) Next, as shown in FIG. 4(B), the lower member 20, the lower intermediate plate member 30, the upper intermediate plate member 32 and the upper member 22 are joined together where the projections 40 are formed, by means of pressure welding.

At that moment, the refrigerant charging holes 42 and 44 remain opened so that they are communicating the interior space of the heat pipe 2 with the exterior thereof.

(C) Next, as shown in FIG. 4(D), a predetermined amount of the liquid refrigerant such as water is charged from one of the opened refrigerant charging holes 42 and 44, i.e., the refrigerant supply opening 42, into the interior space of the heat pipe 2 to thereby be enclosed therein. At that moment, the air inside the interior space is discharged from the air outlet 44. After the enclosure, the refrigerant supply opening 42 and the air outlet 44 are sealed completely, by thermal pressure bonding (i.e., heat press) of the lower member 20 and the upper member 22 at 300 degrees C. and 100 kg/cm², for example. FIG. 4(C) shows the heat pipe after the seal process. Thus, the heat pipe 2 shown in FIGS. 1-3 is manufactured.

EMBODIMENT 2

Figure 5:
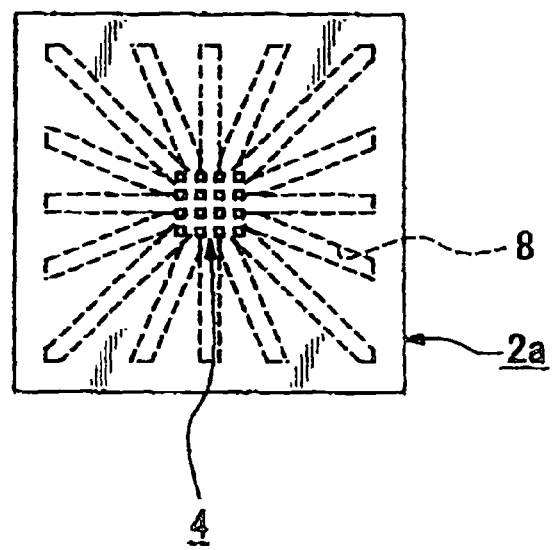
FIG. 5 is a bottom view showing a heat pipe of another embodiment of the invention.

FIG. 5 is a bottom plan view showing a heat pipe 2a in accordance with a second embodiment of the present invention.

The heat pipe 2a of the present embodiment comprises the slits 8 formed to extend radially from the central CPU mounting section 4, and does not differ from the foregoing embodiment shown in FIGS. 1-3 except this point.

According to such heat pipe 2a, the effective heat dissipation toward corners from the central part can be attained, and thus it is possible to allow substantially the whole area of the heat pipe including the corners thereof to make effective contribution to the heat dissipation, thus making it possible to further enhance the heat conduction effect.

EMBODIMENT 3

Figure 6:
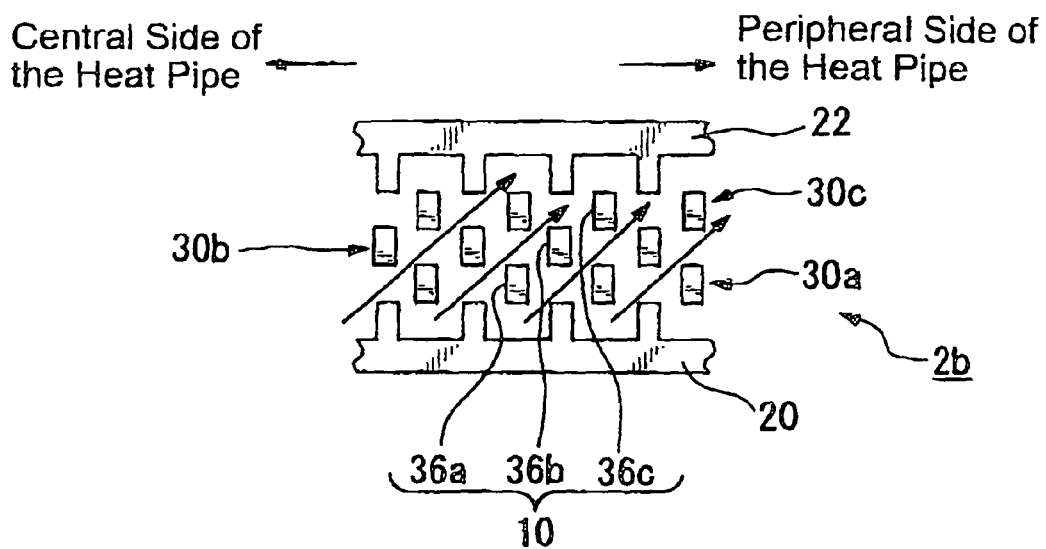
FIG. 6 is a section showing a heat pipe of a further embodiment of the invention

FIG. 6 is a section showing a heat pipe 2b in accordance with a third embodiment of the present invention.

The heat pipe 2b of the embodiment comprises three intermediate plate members 30a, 30b and 30c, and three second through-holes 36a, 36b and 36c for compacting the capillary hole 10, said three through-holes 36a, 36b and 36c being displaced toward the outside so that the capillary hole 10 is extended obliquely outwards. Thus, the refrigerant near the heat pipe 2b that absorbs the heat generated from the device to be cooled is allowed to go up through each capillary hole 10, spreading out toward the outside (peripheral side). Accordingly, heat dissipation tan be performed more effectively.

Figure 7A:
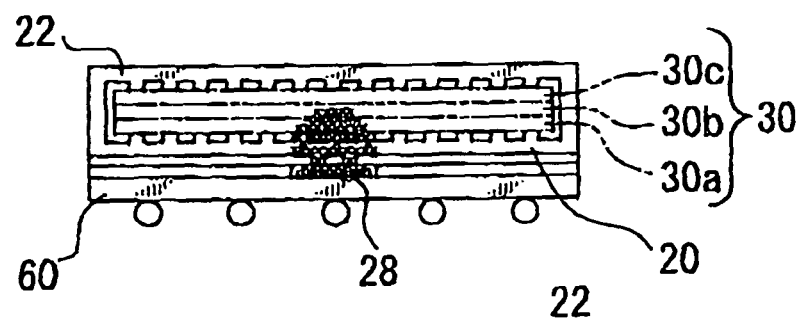
FIGS. 7(A) to 7(C) are each explanatory cross-sectional diagrams briefly illustrating the cooling principle of the heat pipe of the present invention.
Figure 7B:
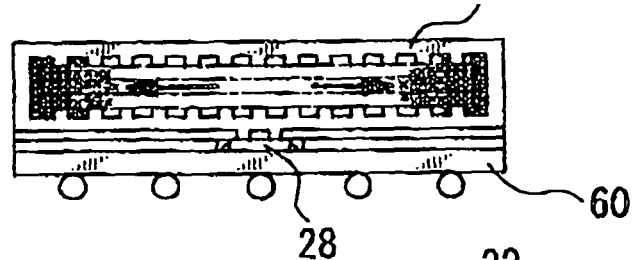
Figure 7C:
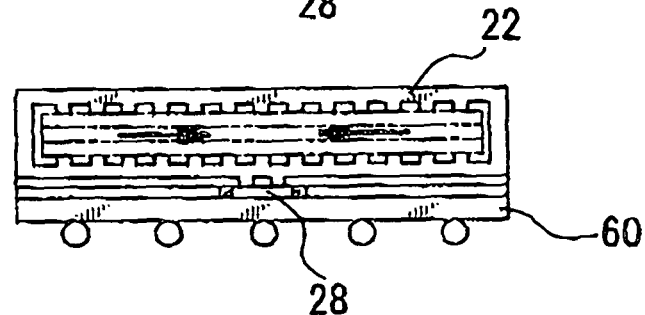

FIG. 7(A) to 7(C) are each explanatory cross-sectional diagrams briefly showing the cooling principle of the heat pipe of the present invention, taking the heat pipe 2b as an example. Accordingly, this principle is common to the foregoing heat pipe 2, 2a and herein-below described heat pipes.

In FIG. 7(A) to 7(C), numeral 28 designates a silicon semiconductor chip, such as CPU as a device to be cooled, and 60 designates a printed-wiring board on which this silicon semiconductor chip 28 is mounted, and 30 designates an intermediate plate laminated body where three intermediate plate members 30a, 30b and 30b are laminated. Symbol "x" in the drawings symbolically denotes the heat generated in the silicon semiconductor chip 28 as a device to be cooled.

(A) When heat is generated from the silicon semiconductor chip 28 as a source of heat generation during the use thereof, heat absorption takes place in the central part (or the device mounting section) of the heat pipe 2b due to the heat conduction through the copper or copper alloy that makes up of the heat pipe 2b. FIG. 7 illustrates such heat absorption phenomenon.

(B) The refrigerant in the heat pipe 2b (for example, water, not shown) cools the silicon semiconductor chip 28 by the evaporation latent heat. At the same time, the vapor of the refrigerant is allowed to diffuse toward a peripheral part mainly through the path of vapor as shown in an arrow in FIG. 7(B) so that it condenses in the peripheral part of the heat pipe 2b. FIG. 7(B) shows the diffusion of vapor toward the peripheral part, in which "x" shows heat symbolically.

(C) Then, the refrigerant condensed and liquefied in the peripheral part of the heat pipe 2b returns to the central part mainly through the capillary holes 10, as shown in an arrow in FIG. 7(C), and then absorbs the heat generated in the silicon semiconductor chip 28 by the evaporation latent heat, as shown in FIG. 7(A).

The above-mentioned cyclical phenomenon of refrigerant is repeated continuously, and thus the heat dissipation is performed effectively.

FIGS. 8(A) and 8(B) are perspective views of a copper plate of 40 mm$^2$ square and 1 mm thickness and the heat pipe 2b of the same dimension and thickness of the present invention, showing the result of heat dissipation simulation where temperature distribution in the case that a 15 mm$^2$ central region of the respective lower portions thereof is heated at 444 kW/m$^2$ is shown schematically.

As is apparent from the drawings, the temperature of the copper plate shown in FIG. 8(A) reached as high as about 340 degrees K in the central part (as illustrated with accumulated "+"), while a ring-like part around the central part reached about 325 degrees K slightly lower than 340 degrees K, (as illustrated with accumulated "−"). Further, a peripheral region around the ring-like part reached about 320 to 300 degrees K (as illustrated with thickly accumulated "x"), and the outermost region around the peripheral region reached about 295 degrees K (as illustrated with thinly accumulated "x").

Namely, in the case shown in FIG. 8(A), the difference of temperature between the central part and the outermost region is very large.

According to the heat pipe 2b of the present invention shown in FIG. 8(B), however, the temperature thereof reached about 320-300 degrees K over the entire region thereof, thus indicating approximately uniform temperature, and no region reached such a high temperature as 340 degrees K as observed in the copper plate.

As is clearly seen from this comparison of temperature distribution illustrated in FIGS. 8(A) to 8(B), the heat dissipation effect of the heat pipe 2b of the invention is extremely stronger than the ordinary copper plate. Specifically, when surface temperature is compared, it has been proven that the heat-dissipation effect of about 20 times the ordinary copper plate can be obtained with the heat pipe 2b of the present invention.

EMBODIMENT 4

Figure 9A:
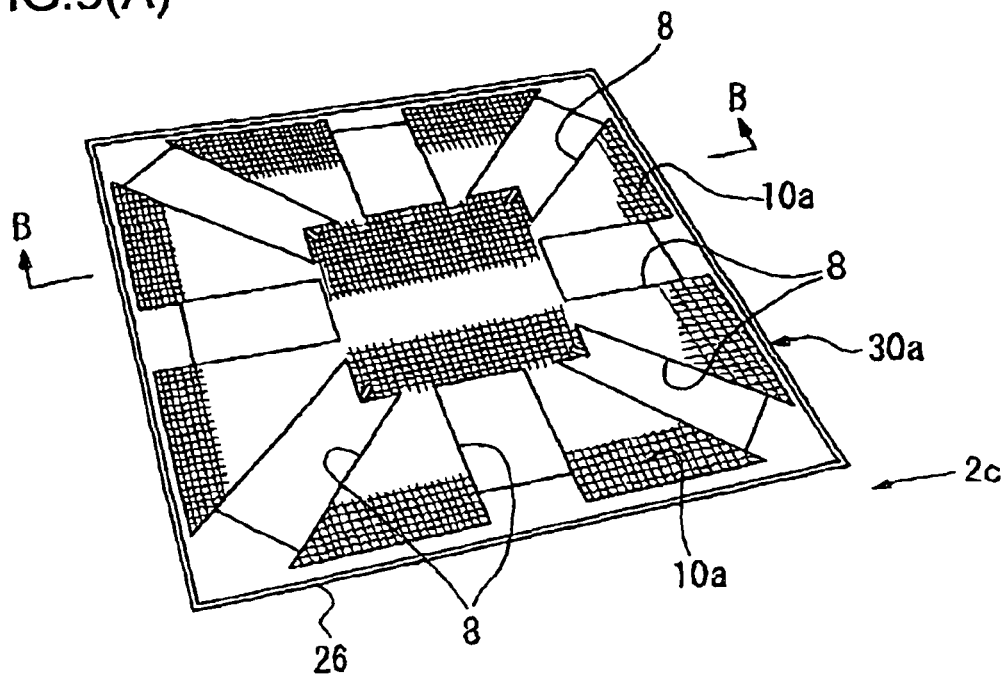
Figure 9B:
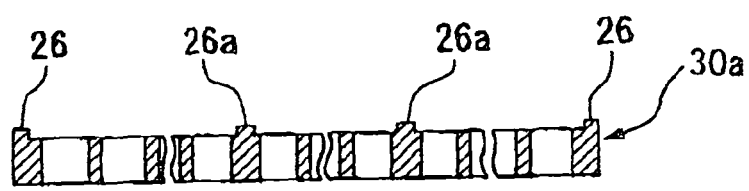
Figure 9C:
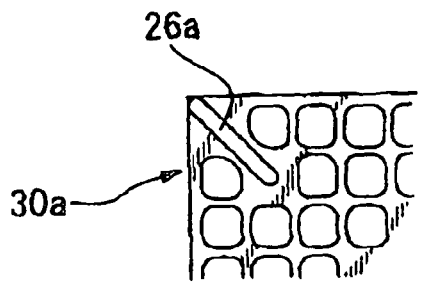

FIGS. 9(A) to 9(C) show an intermediate plate member 30a for use with a heat pipe 2c of a fourth embodiment of the invention, in which FIG. 9(A) is a perspective view thereof, FIG. 9(B) is a section thereof taken along B-B line of FIG. 9(A), and FIG. 9(C) is a plan view of an device mounting section, said device mounting section being formed with a projection for pressure welding.

In the heat pipe 2c of the embodiment, the lower member (not shown), two or more intermediate plate members 30a (only one of them is shown in FIG. 9), and the upper member (not shown) are integrated together by applying heat press not only to the projections 26 in the peripheral part of the heat pipe but also to projections 26a provided from the periphery to the vicinity of the device mounting section in the center of the heat pipe. Accordingly, not only the thermal expansion by the heat from the device to be cooled (popcorn phenomenon), but also the destruction of the heat pipe itself due to the thermal expansion can be prevented, thus improving the reliability of the heat pipe, attaining longer life of the heat pipe.

Figure 10:
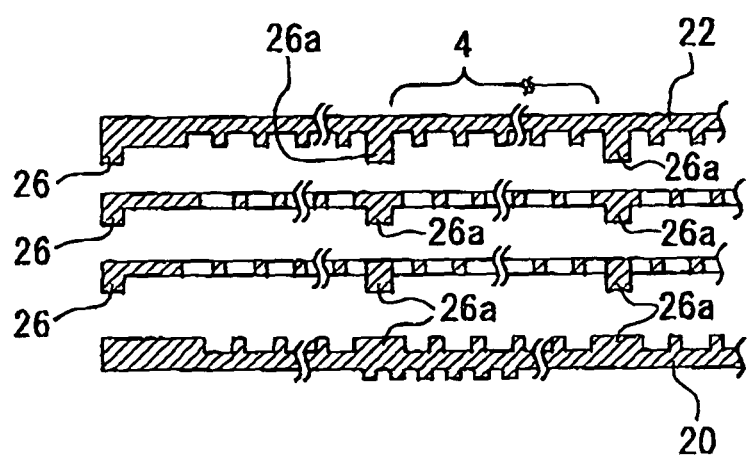
FIG. 10 is a section of an upper member, a lower member and intermediate plate members to be prepared in the case of the manufacture of the heat pipe using the intermediate plate member illustrated in FIG. 9.

Specifically, as shown in FIG. 10, the lower member 20, the intermediate plate members 30a and 30b (which are not limited to two as illustrated in the drawing), and the upper member 22 are provided such that the projections 26 for hot pressure welding are provided in the peripheral portion of one of the opposite members to be joined, and that the projections 26a for hot pressure welding are provided from the periphery to the vicinity of the device mounting section.

Then, these lower member 20, the intermediate plate members 30a and 30b and the upper member 22 are integrated with one another by applying heat press to the projections 26 and 26a, respectively. Thus, the heat pipe prior to the refrigerant being enclosed is prepared.

EMBODIMENT 5

FIGS. 11(A) to 11(E) are sections of a heat pipe manufactured by a method according to another embodiment of the invention, illustrating manufacturing steps thereof in chronological order, featuring a method for enclosing a refrigerant, such as pure water.

(A) The member having a refrigerant charging hole 50 at a pair of opposite corners of the heat pipe is used. This upper member 22, the intermediate plate members 30a, 30b and 30c (whose detailed structure is not shown) and the lower member 20 are integrated together by applying heat press to the above-mentioned projections 26 and/or 26a. The refrigerant charging hole 50 includes one or more degassing grooves 50a on a peripheral inner surface thereof. In the present embodiment, there appears only one degassing groove 50a in each refrigerant charging hole 50.

The degassing groove 50a is formed such the it keeps the interior of the heat pipe in communication with the error thereof as long as a hereinafter-described sealing spherical body 56 is simply placed on the refrigerant charging hole 50, or during such a state that the sealing of the refrigerant charging hole 50 has only proceeded to some extent, while it is closed by the sealing spherical body 56 when the refrigerant charging hole 50 is completely sealed and closed by the sealing spherical body 56. In the meantime, the structure of the degassing groove 50a will be explained with reference to FIGS. 12(A) and 12(B) later.

Then, as shown in FIG. 11(A), the refrigerant (pure water, for example) is supplied to the interior of the heat pipe from one of the refrigerant charging holes 50 (i.e., refrigerant supplying hole), using a refrigerant dispenser 52. The other of the refrigerant charging holes 50 serves as an air outlet which discharges the air at the time of the supply of refrigerant, and plays a role to allow the supply of refrigerant to the interior to be performed smoothly.

(B) FIG. 11(B) shows a state after the refrigerant is supplied.

(C) Next, a plurality of the sealing spherical bodies 56 made from ductile metal such as solder are prepared. In that case, the number of the sealing spherical bodies to be prepared should be the same as the number of all the refrigerant charging holes 50 of the heat pipes that are manufactured at the same time. It should be noted that in fact a large number of the heat pipes are manufactured at the same time. Then, as shown in FIG. 11(C), each spherical body 56 is placed on each refrigerant charging hole 50.

(D) Thereafter, as shown in FIG. 11(D), pressure-reduction vacuum deaeration (at 0.5 KPs, for example) is carried out through the degassing groove 50a for about 10 minutes. That is, degassing of the heat pipe interior is carried out. Arrows illustrated in the drawing show the degassing directions, respectively.

(E) Next, applying pressure (for example, 40-60 kg/cm$^2$) to the spherical bodies 56 by press, for example, is started. Further, with that pressed state being retained, heating (for about 120 degrees C.) is started, and this heating is allowed to last for about 10 minutes, for example. Thereafter, heating and vacuuming are stopped, and pressurizing is released.

Thus, the sealing spherical bodies 56 made from ductile metal such as solder is turned into plastic flow primarily due to pressurization and secondarily due to heating, thus enabling the refrigerant charging holes 50 inclusive of the degassing grooves 50a to be sealed. Then, the pressurization, heating, and vacuuming processes are finished.

Then, as shown in FIG. 11(E), the ductile metallic body serves as a sealing plug 58 which seals the refrigerant charging hole 50.

According to the heat pipe manufacturing method (or refrigerant enclosing method) of the invention, the spherical body 56 which is to serve as the sealing plug 58 is placed on each refrigerant charging hole 50 under vacuum, and then pressurized and heated after degassing, whereby simultaneous enclosure of the refrigerant can be carried out all at once. Accordingly, mass-productivity can be enhanced.

Figure 12A:
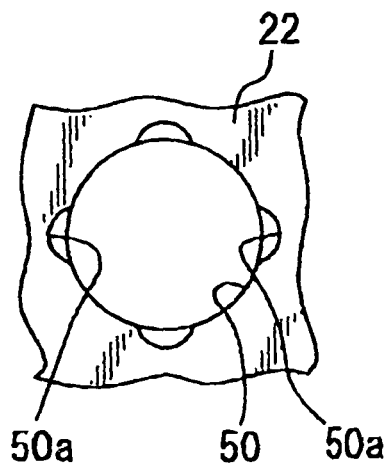
Figure 12B:
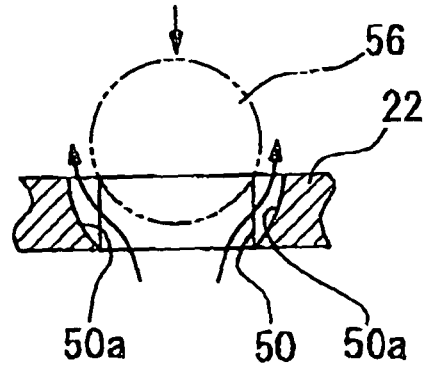

FIGS. 12(A) and 12(B) show one example of the refrigerant charging hole 50 formed on the upper member 20 of the heat pipe of the invention, in which FIG. 12(A) is a plan view thereof, while FIG. 12(B) is a section thereof.

The refrigerant charging hole 50 is formed cylindrical including one or more degassing grooves 50a (four, in this example) provided on a peripheral inner surface thereof.

Each degassing groove 50a is not sealed by the spherical body 56 as long as the spherical body 56 made from solder, for example is simply placed on the refrigerant charging hole 50, or the sealing has only advanced to melting of the solder.

Thus, under that condition, the interior of the heat pipe is in communication with the exterior thereof through the degassing grooves 50a, thus enabling the degassing process.

However, when the melting of the spherical body 56 proceeds so that the refrigerant charging hole 50 is completely sealed and closed by the spherical body 56, the degassing groove 56a also is sealed by the spherical body 56.

Under that condition, the interior of the heat pipe is completely shut off from the exterior thereof by the sealing plug 58 made from ductile metal, and thus the refrigerant is allowed to be completely enclosed in the interior of the heat pipe so that no leakage of the refrigerant occurs.

Figure 13A:
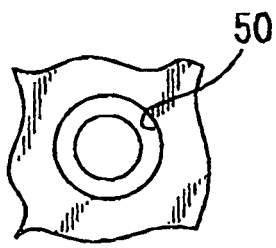
Figure 13B:
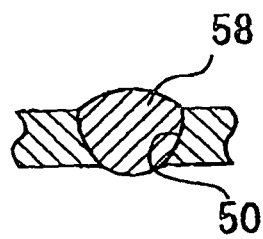

FIGS. 13(A) and 13(B) show another example of the refrigerant charging hole 50 formed on the upper member 22 of the heat pipe of the invention, in which FIG. 13(A) is a plan view thereof, while FIG. 13(B) is a section thereof.

In this example, the refrigerant charging hole 50 is formed so that it may have a larger diameter at an upper end, and becomes gradually small downward so that it may has a minimal diameter at a lower end.

Figure 14A:
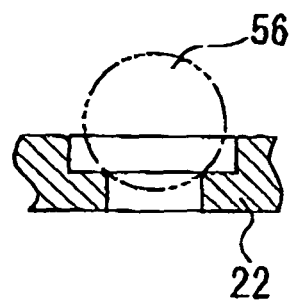
Figure 14B:
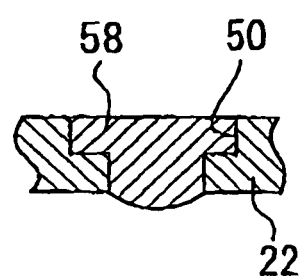

FIGS. 14(A) and 14(B) show a further example of the refrigerant charging hole 50 formed on the upper member 22 of the heat pipe of the invention, in which FIG. 14(A) is a section prior to sealing, while FIG. 14(B) is a section after sealing.

In this example, the refrigerant charging hole 50 is formed to have a larger diameter in a top portion, and a smaller diameter in a bottom portion, while an upward step portion is formed therebetween.

According to the refrigerant charging hole 50 thus formed, the remainder of the ductile metallic body that has fully filled the smaller bottom portion is allowed to be appropriately accommodated into the larger top portion, thereby enabling the same to be prevented from protruding from the outside surface of the heat pipe. As a result, it is possible to prevent any projection that may impair the flatness of the heat pipe from being produced by the sealing process.

Alternatively, in either example shown in FIGS. 13 and 14, the degassing groove may be provided therein like in the example shown in FIG. 12.

Generally the present invention is applicable to a thin and tabular heat pipe having a good heat conductance, and a manufacturing method thereof.

The present invention is not to be limited by this example, and configurations which can obtain a similar effect by substituting or modifying a substantially equivalent concept by a person skilled in the art, also belong within the scope of the present invention.

The invention claimed is:

1. A heat pipe comprising:
an upper member having a concave portion on a lower surface;
a lower member having a concave portion on an upper surface;
one or more intermediate plate members provided between the upper member and the lower member, each intermediate plate member including a plurality of slits, constructing a vapor path extending in a planar direction, communicating with the concave portions of the upper and lower members to form a sealed space defined by the slits and the concave portions, and a refrigerant enclosed in the sealed space;
capillary holes formed through a non-slitted portion of each intermediate plate member, the capillary holes serving as a capillary path of flow extending vertically or both vertically and horizontally, communicating with the concave portions of the upper and lower members; and
a device mounting section provided on an outer surface of at least one of the upper and lower members, the device mounting section being to be cooled by the heat pipe;
wherein the upper member, intermediate plate member and lower member are joined to each other by hot pressure-welding of projections partially formed in a peripheral portion of the heat pipe and from a peripheral portion of the device mounting section to a neighborhood thereof.

2. The heat pipe according to claim 1, wherein the intermediate plate members are more than one, each intermediate plate member having the capillary hole defined as a though-hole having a certain planar area, such that the though-holes are overlapped only partially to define the capillary path of flow having a planar area narrower than that of each through-hole.

3. The heat pipe according to claim 1, wherein the device mounting section is formed integrally with a plurality of projections.

4. The heat pipe according to claim 1, wherein the heat pipe has a rectangular planar shape, the device mounting section is arranged in the center of the heat pipe, and each of the slits extends in an oblique direction relative to sides of the heat pipe.

5. The heat pipe according to claim 1, wherein said heat pipe has a rectangular planar shape, wherein said device mounting section is arranged in the center of said heat pipe, while each of said slits extends in a radial direction from said device mounting section.

6. The heat pipe according to claim 5, wherein said upper member, intermediate plate members and lower member are joined to each other by hot pressure-welding of projections partially formed in a peripheral portion of said heat pipe and from a peripheral portion of said device mounting section to a neighborhood thereof.

7. A heat pipe comprising:
    an upper member having a concave portion on a lower surface;
    a lower member having a concave portion on an upper surface;
    one or more intermediate plate members provided between the upper member and the lower member, each intermediate plate member including a plurality of slits, constructing a vapor path extending in a planar direction, communicating with the concave portions of the upper and lower members, the members being stacked to form a sealed space defined by the slits and the concave portions;
    one or more refrigerant charging holes formed through one of the upper and lower members, each charging hole communicating with the sealed space;
    a refrigerant enclosed in the sealed space; and
    a sealing plug for sealing each refrigerant charging hole, the sealing plug being made from ductile metal;
    wherein each refrigerant charging hole has a larger diameter in an upper portion thereof than in a lower portion thereof, while a surface of the sealing plug for sealing each refrigerant charging hole does not protrude from an outer surface of the member formed with the refrigerant charging hole.

8. The heat pipe according to claim 7, further comprising one or more degassing grooves formed on a peripheral inner surface of each refrigerant charging hole, wherein the degassing groove keeps an interior space communicated with an exterior space until each refrigerant charging hole is sealed fully by the sealing plug, while the degassing groove allows the refrigerant charging hole is sealed when each refrigerant charging hole is sealed rally by the sealing plug.

* * * * *